United States Patent [19]

Mutoh

[11] Patent Number: 5,484,252
[45] Date of Patent: Jan. 16, 1996

[54] SAMPLE HOLDING APPARATUS

[75] Inventor: Hiroto Mutoh, Tokyo, Japan

[73] Assignee: Seiko Instruments Inc., Tokyo, Japan

[21] Appl. No.: 199,446

[22] Filed: Feb. 22, 1994

[30] Foreign Application Priority Data

Feb. 22, 1993 [JP] Japan ................... 5-032303

[51] Int. Cl.⁶ .................................. B65G 47/24
[52] U.S. Cl. .................... 414/783; 414/757; 414/781; 414/784; 414/936; 414/941
[58] Field of Search ................... 414/783, 936, 414/941, 757, 781, 784; 294/103.1

[56] References Cited

U.S. PATENT DOCUMENTS

| | | | |
|---|---|---|---|
| 4,892,455 | 1/1990 | Hine | 414/936 X |
| 4,944,650 | 7/1990 | Matsumoto | 414/936 X |
| 5,374,147 | 12/1994 | Hiroki et al. | 414/936 X |

FOREIGN PATENT DOCUMENTS

| | | | |
|---|---|---|---|
| 62-32625 | 2/1987 | Japan | 414/936 |
| 3-8611 | 1/1991 | Japan | 414/941 |

Primary Examiner—Michael S. Huppert
Assistant Examiner—Janice L. Krizek
Attorney, Agent, or Firm—Loeb and Loeb

[57] ABSTRACT

In a sample holding apparatus including a main body, a holding body movably provided to the main body, a spring disposed to urge the main body and the holding body toward one another, pins fixed to the main body and the holding body for holding a sample, holding and releasing of the sample are effected by action of a moving stroke of the sample holding apparatus itself and a support member fixed to the sample holding apparatus without requirement for special drive components.

6 Claims, 2 Drawing Sheets

SAMPLE HOLDING APPARATUS

BACKGROUND OF THE INVENTION

The present invention relates to a sample holding apparatus for a sample such as a wafer which is to be carried repeatedly between a preliminary sample chamber and a main sample chamber, with the sample being exchanged in the preliminary sample chamber.

In known sample holding apparatus a mounted sample may be held by means which utilizes a human force, an exclusive electric drive source, or a pressure difference applied to the circumference of the sample.

In many cases, supply of a sample to a sample holding apparatus is made by an automatic supply means particularly when a semiconductor wafer or the like is to be held, and it is inconvenient to use a holding means for the mounted sample which relies on human hands. Moreover, even when such a holding means relies on an electrical means, there have been such unpreventable problems that its construction becomes very complicated, its cost is increased, and the like. Further, when the sample holding apparatus is inserted in a vacuum for use, it is impossible to use a holding means utilizing a pressure difference between the front and rear surfaces of the sample, and sample holding means utilizing static electricity has also not been used in practice for technical end economic reasons.

SUMMARY OF THE INVENTION

In view of the above-mentioned problems, the present invention has the object of performing gripping and releasing of a sample mounted on a sample holding apparatus by use of the displacement caused when moving the holding apparatus.

In a structure for gripping and releasing a sample by expansion and contraction, respectively, of a sample holding apparatus and a sample holding apparatus body where a part, e.g. a holding body, of the sample holding apparatus is movable with respect to the sample holding apparatus body, it is considered that, by utilizing a support member fixedly provided to the exterior of the sample holding apparatus, when the sample holding apparatus is placed at a given stop position within a preliminary sample chamber, a sample is released by increasing the distance between the sample holding apparatus body and the holding body, and when the sample holding apparatus is carried from the preliminary sample chamber to a main sample chamber by means of an arbitrary sending means, the distance between the sample holding apparatus body and the holding body is reduced by changing the position of the sample holding apparatus, thereby holding the sample.

DESCRIPTION OF THE PREFERRED EMBODIMENTS

The embodiments of the present invention will be described below with reference to the drawings.

Figure 1:
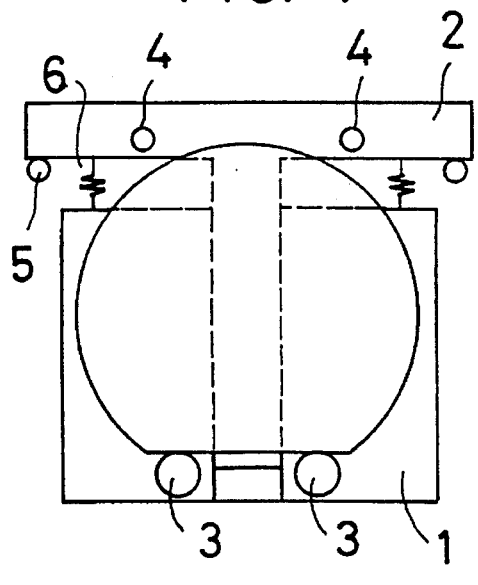
FIG. 1 is a plan view showing an embodiment of a sample holding apparatus according to the invention in a state for releasing a sample.

FIG. 1 shows an embodiment of a sample holding apparatus in accordance with the present invention. A sample 7 held by the sample holding apparatus of this embodiment is a semiconductor wafer. The sample 7 has the shape of a substantially circular flat plate, with a peripheral portion of the circular shape being cut by a straight line.

On a sample holding apparatus body 1 having a plane surface on which the sample 7 is mounted, a pair of pins 3 are fixedly provided for defining the position of the sample 7 in one direction. On the body 1, a holding body 2 is attached which is movable in the one direction.

On the holding body 2, a pair of pins 4 are fixedly provided for holding the sample 7 together with pins 3. By the action of an elastic body or bodies, e.g. spring or springs 6, which tie the body 1 to the holding body 2 with such a force as to always urge body 1 and the holding body 2 toward each other, the sample 7 is gripped between the pins 3 of the body and the pins 4 of the holding body 2.

Figure 2:
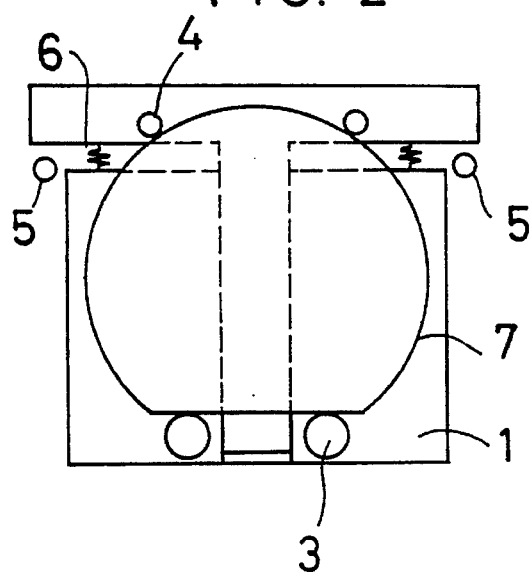
FIG. 2 a plan view similar to that of FIG. 1 showing the apparatus of FIG. 1 in a sample holding state.

A support member 5 is fixedly provided to the exterior of said sample holding apparatus, and the holding body 2 is free from restraint of support member 5 by changing the relative position between the sample holding apparatus and support member 5 with the movement of the sample holding apparatus, as a result of which the sample can be held as shown in FIG. 2. That is, the support member 5 is attached to body apparatus (not shown) on which the sample holding apparatus is mounted, the support member 5 is hung on a protrusion of the holding body 2 at the side of the body 1, and the distance between the pins 3 of the body 1 and the pins 4 of the holding body 2 is increased so that the sample 7 is mounted on the body 1. Then, the support member 5 is moved away from the protrusion of the holding body 2 at the side of the body 1 so that the sample 7 is gripped between the pins 3 of the body 1 and the pins 4 of the holding body 2 by means of spring or springs 6 which produce a force in a direction that the body 1 and the holding body 2 are attracted to each other.

Figure 5:
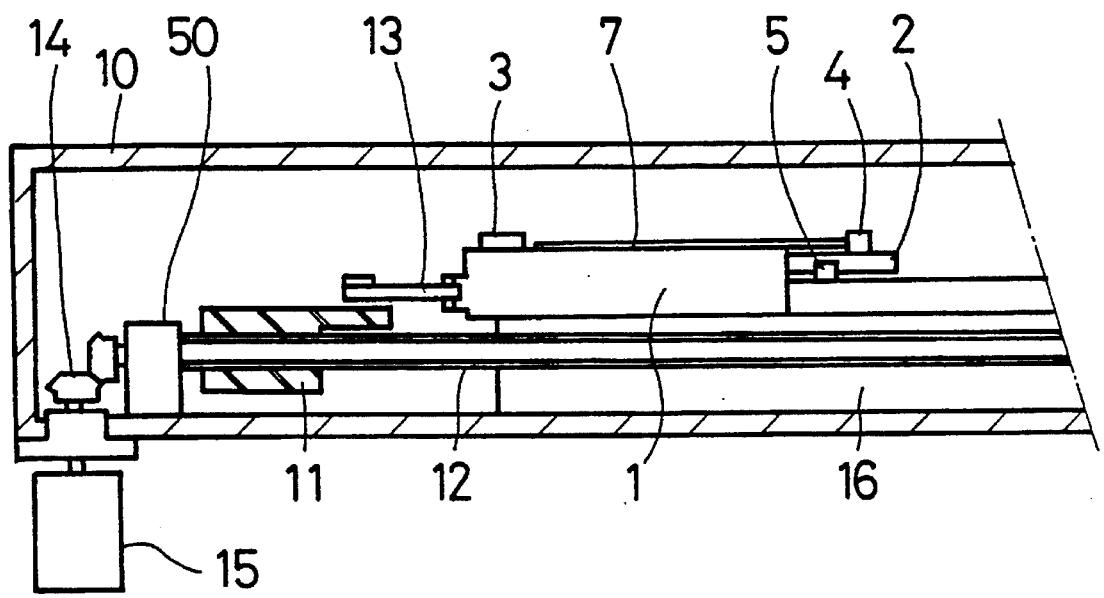
FIG. 5 is a cross sectional view showing an example of a sample carrying system using a sample holding apparatus according to the invention.
Figure 6:
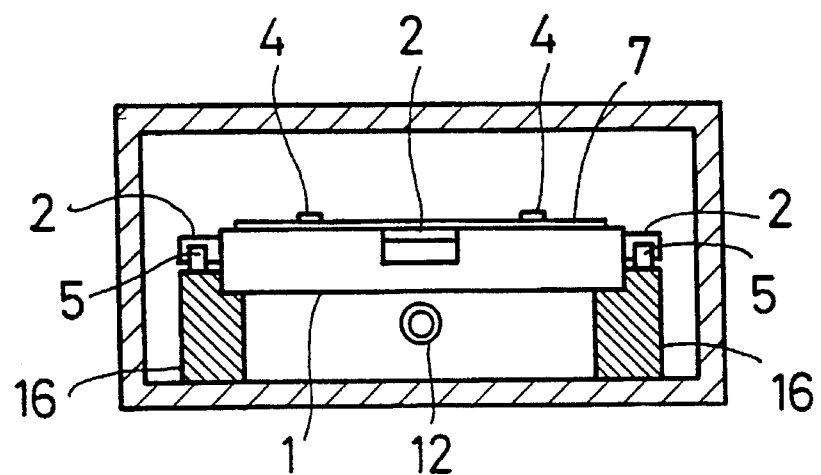
FIG. 6 is a lengthwise sectional view showing an example of a sample carrying system using a sample holding apparatus.

FIG. 5 is a cross sectional view showing an example of a sample carrying system using a sample holding apparatus according to the present invention, and FIG. 6 is a lengthwise sectional view showing the sample carrying system of FIG. 5. An example using the present invention will be described with reference to FIGS. 5 and 6 below.

A transporting screw 12 is rotatably driven by a drive section 15 and a drive transmission system 14 both fixed to a preliminary sample chamber 10. Screw 12 is rotatably supported by a bearing 50. A nut 11 is moved forward and backward on the shaft of screw 12 by the rotation of screw 12 while the nut 11 is engaged with screw 12.

The nut 11 is carried and taken out between a main sample chamber (not shown) and the preliminary sample chamber 10 while the sample holding apparatus which is guided by a guide 16 is held by a coupling unit 13. The position of the holding body 2 is limited by the support member 5 fixed on the guide 16. Consider, for example, a case where the sample holding apparatus returns from the main sample chamber to preliminary sample chamber 10 while holding a sample. First the holding body 2 is engaged by the support member 5, and then the body 1 is further returned by the nut 11. As a result, the distance between pins 3 of body 1 and pins 4 of holding body 2 is increased as shown in FIG. 1, and the sample 7 is released.

On the contrary, when the sample holding apparatus is carried to the main sample chamber, the operation is reverse to that described above, and body 1 and sample 7 are moved forward by nut 11. Then, with sample 7 gripped by pins 3 of body 1 and pins 4 of holding body 2, holding body 2 is sent to the main sample chamber together with the body 1.

According to this embodiment, as described above, holding and releasing of a sample mounted on the sample holding apparatus can be performed by use of a stroke of movement of the sample holding apparatus without use of a separate or additional drive means.

Figure 3:
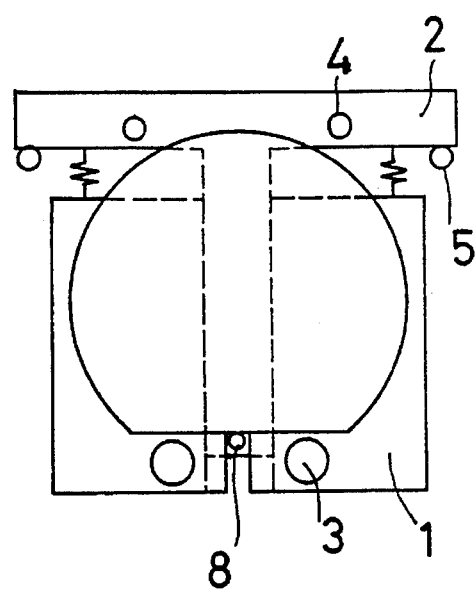
FIG. 3 is a plan view similar to that of FIG. 1 showing another embodiment of a sample holding apparatus according to the invention.

FIG. 3 shows another embodiment according to the present invention in which a sample pressing section 8 is fixed to the holding body 2 to move sample 7 away from pins 3, while pins 4 also move away from sample 7, when body 2 moves to the release position. Further, since the sample pressing section 8 enables the sample 7 to be separated from pins 3 when automatically replacing the sample, the contact portion can be reduced. As a result, the sample is little damaged, and the generation of powder caused by friction during replacement can be prevented. These are advantages of the present invention.

Figure 4:
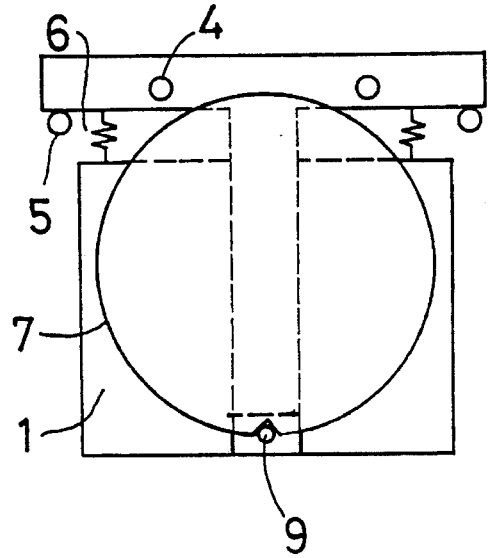
FIG. 4 is a plan view similar to that of FIG. 1 showing a further embodiment of a sample holding apparatus according to the invention.

FIG. 4 shows an example where the present invention is applied to a semiconductor wafer having a locating, or orientation, notch. The notch position is determined by a fixing member 9 fixed to the body 1.

According to the present invention the following effects are attained.

(1) Without use of a specific drive means for holding and releasing of a sample, by use of the movement operation of a sample holding apparatus, the sample holding and releasing operations can be surely performed at a low cost with a simplified structure regardless of whether the apparatus is in a vacuum environment or is exposed to the atmosphere.

(2) In the case where the sample is automatically exchanged, or replaced, holding and releasing of the sample can be performed with reduced dust.

(3) The speed of gripping and releasing the sample can be changed.

This application relates to subject matter disclosed in Japanese Application number 5-32303, filed on Feb. 22, 1993, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. In a sample holding apparatus in which a sample having an edge surface is held and displaced between a preliminary test chamber and a main sample chamber by a transfer means, the improvement comprising: a main body which linearly moves with the transfer means in a movement direction between the preliminary test chamber and the main sample chamber; at least one main body pin fixed to said main body for holding the edge surface of the sample; a holding body mounted on said main body and slidable relative to said main body in the movement direction of the main body during movement of said sample holding apparatus in the vicinity of a stop position within the preliminary test chamber; a plurality of holding body pins fixed to said holding body for holding the edge surface of the sample together with said main body pin; an elastic member having one end fixed to said main body and a second end fixed to said holding body for continuously providing a force which attracts said holding body to said main body; and a support member fixed to be brought in contact with said holding body from the exterior of the sample holding apparatus when the sample holding apparatus is brought to the stop position within the preliminary test chamber, whereby, when the sample holding apparatus moves in the movement direction from the preliminary test chamber to the main sample chamber, the sample is held by said main body and said holding body and when the test holding apparatus moves in a reverse direction the sample is released.

2. The sample holding apparatus claimed in claim 1 further comprising a sample pressing section fixed to said holding body at a location for moving the sample away from said at least one main body pin, whereby said sample pressing section enables the sample to be separated from said holding body when said holding body pins are moved away from the sample to release the sample.

3. The sample holding apparatus claimed in claim 1 wherein the sample has an orientation notch at the edge surface and said at least one main body pin is located and dimensioned to engage in the orientation notch for holding the sample.

4. The sample holding apparatus claimed in claim 1 wherein said at least one main body pin comprises a plurality of main body pins which are centered on a line that lies perpendicular to the movement direction.

5. The sample holding apparatus claimed in claim 1 wherein said support member is fixed in position in the preliminary test chamber and sliding of said holding body relative to said main body is effected by movement of said main body in the movement direction while said support member is in contact with said holding body.

6. The sample holding apparatus claimed in claim 1 wherein said plurality of holding body pins comprises two holding body pins and said at least one main body pin is located relative to said two holding body pins such that said main body pin is centered on a first line that is perpendicular to a second line extending between said two holding body pins, and the first line intersects the second line at a point equidistant from said two holding body pins.

\* \* \* \* \*